United States Patent [19]

Negahban-Hagh

[11] Patent Number: 5,168,179
[45] Date of Patent: Dec. 1, 1992

[54] BALANCED MODULATOR FOR AUTO ZERO NETWORKS

[75] Inventor: Mehrdad Negahban-Hagh, Irvine, Calif.

[73] Assignee: Silicon Systems, Inc., Tustin, Calif.

[21] Appl. No.: 769,338

[22] Filed: Oct. 1, 1991

Related U.S. Application Data

[63] Continuation of Ser. No. 267,017, Nov. 4, 1988, abandoned.

[51] Int. Cl.⁵ ............ G06G 7/12; H03K 5/00; H03F 1/02
[52] U.S. Cl. .................. 307/491; 307/494; 307/520; 328/127; 328/165; 328/167; 330/9
[58] Field of Search .......... 307/491, 493, 494, 497, 307/520, 521, 529; 328/127, 165, 167; 330/9, 107, 109; 332/167, 170, 175, 178

[56] References Cited

U.S. PATENT DOCUMENTS

| | | | |
|---|---|---|---|
| 4,329,599 | 5/1982 | Gregorian et al. | 307/497 |
| 4,331,894 | 5/1982 | Gregorian et al. | 307/497 |
| 4,393,351 | 7/1983 | Gregorian et al. | 307/491 |
| 4,438,354 | 3/1984 | Hague et al. | 307/491 |
| 4,510,467 | 4/1985 | Chang et al. | 332/170 |
| 4,617,481 | 10/1986 | Masuda | 307/491 |
| 4,707,624 | 11/1987 | Yee | 307/494 |
| 4,714,843 | 12/1987 | Smith | 307/491 |
| 4,754,226 | 6/1988 | Lusignan et al. | 307/520 |

*Primary Examiner*—Janice A. Howell
*Assistant Examiner*—Trong Quang Phan
*Attorney, Agent, or Firm*—Hecker & Harriman

[57] ABSTRACT

A balanced modulator for use with auto-zero networks is described. The present invention is a switched capacitor balanced modulator suitable for use in auto-zero networks where a valid input signal is available only at one phase. The present invention changes the polarity of the input signal by adjusting a switched feedback capacitor, making it possible for the switched input capacitor to sample only at one (valid) phase. The balanced modulator of the present invention may be utilized with first order auto-zero low pass filters or other switched capacitor blocks, such as gain blocks, first order high pass filters, etc.

7 Claims, 1 Drawing Sheet

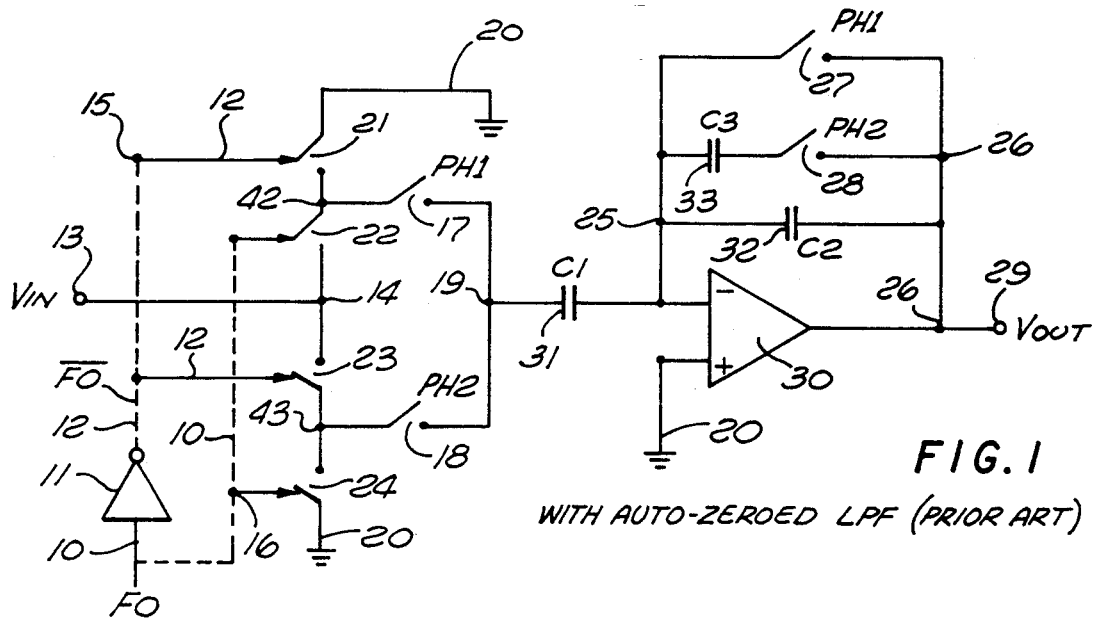
FIG. 1
WITH AUTO-ZEROED LPF (PRIOR ART)
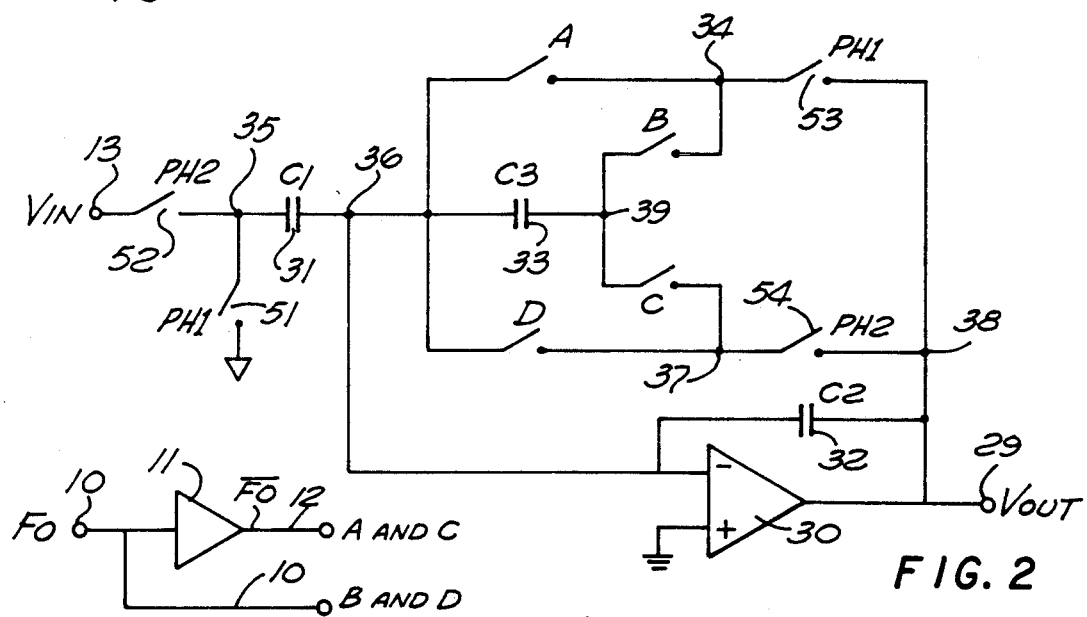
FIG. 2
WITH AUTO-ZEROED LPF SUITABLE FOR PLACES WHERE SIGNAL IS ONLY AVAILABLE AT ONE PHASE.
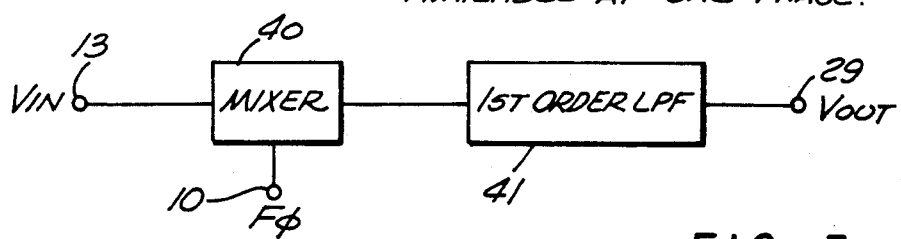
FIG. 4
FIG. 3

BALANCED MODULATOR FOR AUTO ZERO NETWORKS

This is a continuation of application Ser. No. 267,017 filed Nov. 4, 1988 now abandoned.

BACKGROUND OF THE INVENTION

1. Field of the Invention

This invention relates to the field of balanced modulators and, in particular, to balanced modulators for use in switched capacitor auto zeroed networks.

2. Background Art

When implementing operational amplifiers in integrated circuits, ideal characteristics are difficult to achieve. Ideally, when a zero voltage is applied between the inputs of an operational amplifier, the output voltage is zero. In actual amplifiers, however, process variations which result in an imperfect matching of components within the amplifier lead to a positive or negative output voltage when the inputs are forced to zero. The magnitude of the output voltage is directly proportional to the open loop gain of the amplifier and is called output offset voltage.

In order to eliminate the effect of offset voltage, a scheme called "auto zeroing" is utilized. In auto zeroing, a two phase switching scheme is used. In one phase, an input voltage Vin is inputted to one input of an operational amplifier through a capacitor, with the other input being tied to a reference voltage (typically ground). During the second phase, both inputs are tied to ground to compensate for the effect of offset voltage and to automatically "zero" the amplifier. Thus, input voltage signals are only available (valid) during one phase of operation.

In signal processing for communications applications, it is often desired to modulate an input signal from one frequency band to another frequency band by multiplying the input signal by a second signal such as a simple waveform (generally sinusoidal or square). Typically, operational amplifiers are utilized to integrate the input signal with the modulating signal to result in a modulated output signal. Analog switched capacitor technology has been found to be very effective in implementing such modulators on integrated circuit chips. To provide a modulator which is immune to the effects of offset voltage variations, auto-zero networks are often employed. However, because the input signal is coupled to the amplifier at only one phase, the output signal from the amplifier is typically valid at only one phase.

One particular type of modulator is balanced modulator. One application of a balanced modulator is to suppress a carrier of a transmission signal. If a balanced modulator is combined with a low pass filter, a single side band (SSB) signal may be generated.

Prior art balanced modulators utilizing switched capacitor networks require an input signal at both phases of a clock. Thus, these prior art balanced modulators are not suitable for use with auto-zero networks where, as has been pointed out, the input signal is usually available at only one phase.

Therefore, it is an object of the present invention to provide a balanced modulator for use in an auto-zero network.

It is further object of the present invention to provide a balanced modulator which will operate when an input signal is only available at one clock phase.

It is yet another object of the present invention to provide a balanced modulator which will operate when an input signal is only available at one clock phase.

It is yet another object of the present invention to provide a switching scheme which is suitable for use in auto-zero networks in which an input signal is available at only one phase.

It is yet another object of the present invention to provide a switching scheme which is suitable for use in auto-zero networks in which an input signal is available at only phase.

SUMMARY OF THE PRESENT INVENTION

A balanced modulator for use with auto zero networks is described. The present invention is a switched capacitor balanced modulator suitable for use in auto zero networks where a valid input signal is available only at one phase. The present intention changes the polarity of the input signal by adjusting a switched feedback capacitor, making it possible for the switched input capacitor to sample only at one (valid) phase. The balanced modulator of the present invention may be utilized with first order auto-zero low pass filters or other switched capacitor blocks, such as gain blocks, first order high pass filters, etc.

BRIEF DESCRIPTION OF THE DRAWINGS

FIG. 1 is an electrical schematic illustrating a prior art mixer used in conjunction with an auto zero low pass filter.

FIG. 2 is an electrical schematic illustrating the preferred embodiment of the present invention employed as a mixer with an auto zero low pass filter.

FIG. 3 is a block diagram illustrating the preferred embodiment of the present invention.

FIG. 4 is a schematic illustrating the generation of the modulating signal employed in the preferred embodiment of the present invention.

DETAILED DESCRIPTION OF THE PRESENT INVENTION

A balanced modulator for use with auto zero networks is described. In the following description, numerous specific details, such as polarity, frequency, etc., are set forth in order to provide a more thorough description of the present invention. It will be obvious, however, to one skilled in the art, that the present invention may be practiced without these specific details. In other instances, well known features have not been described in detail in order not to unnecessarily obscure the present invention.

PRIOR ART

A prior art modulator with a low pass filter is illustrated in FIG. 1. An input signal Vin 13 is modulated by modulating signal (FO) 10. Vin is directly coupled to the prior art mixer of FIG. 1 at node 14.

Modulating signal FO is coupled to node 16 and to inverter 11. The output 12 of inverter 11, ($\overline{FO}$) is coupled to node 15. Switch 22 is coupled to node 16 and switches between node 42 and node 14, (Vin). Switch 23 is coupled to node 15, ($\overline{FO}$), and switches between node 43, ($\overline{FO}$), and node 14, (Vin).

Switch 21 is coupled to node 15, ($\overline{FO}$), and switches between ground and node 42. Switch 24 is coupled to node 16, (FO), and switches between ground and node 43. Node 42 is coupled through switch 17 to node 19.

Switch 18 is coupled to node 43 and to node 19. Node 19 is one terminal of input capacitor 31.

The other terminal of input capacitor 31 is coupled to the inverting input of operational amplifier 30. The inverting input of amplifier 30 is coupled to node 25. The non-inverting input of amplifier 30 is coupled to node 20 which is also coupled to ground. The output of operational amplifier 30 is coupled to node 26. The output of the circuit of FIG. 1 Vout 29 is taken from node 26.

A first feedback capacitor 32 is coupled between nodes 25 and 26. A second feedback capacitor 33 is coupled at one terminal to node 25 and through switch 28 to node 26. Switch 27 is coupled between nodes 25 and 26 as well.

Switches 21 and 23, coupled to node 15, are closed when node 15, ($\overline{FO}$), is high. Switches 22 and 24, coupled to node 16, are closed when node 16, (FO), is high. Thus, switches 21 and 23 are closed when switches 22 and 24, are open and vice versa.

Switches 17 and 27 are coupled to clock signal PH1 and are closed when PH1 is high. Switches 18 and 28 are coupled to clock signal PH2 and are closed when PH2 is high. PH1 and PH2 are non overlapping clock signals so that switches 17 and 27 are closed when switches 18 and 28 are open and vice versa. PH1 and PH2 are of much higher frequency than FO.

In operation, the opening and closing of switches 21-24 under the control of signals FO and $\overline{FO}$ results in node 14 being alternately coupled to node 42 and 43. Namely, node 14 is coupled to node 42 when FO is high and node 14 is coupled to node 43 when $\overline{FO}$ is high.

Taking first the case when FO is high, input capacitor 31 is coupled to Vin through switch 17 when PH1 is high. When PH2 is high, capacitor 31 is coupled to ground through switch 24.

Taking next the case when $\overline{FO}$ is high, capacitor 31 is coupled to Vin through switch 18 when PH2 is high. When PH1 is high, capacitor 31 is coupled to ground 20 through switch 21. Because input capacitor 31 must sample at both phases, Vin must always be available at phases PH1 and PH2. Thus, the modulator of FIG. 1 is not suitable for auto-zero networks, where the input signal is only valid at one phase.

PREFERRED EMBODIMENT OF THE PRESENT INVENTION

Referring to FIG. 2, the preferred embodiment of the present invention is illustrated. The preferred embodiment of the present invention comprises a mixer in conjunction with an auto zero low pass filter (shown in block diagram in FIG. 3).

Still referring to FIG. 2, the input signal Vin 13 is coupled through a switch 52 to node 35. Node 35 is coupled through switch 51 to ground and to one terminal of input capacitor 31. The other terminal of input capacitor 31 is coupled to node 36. Node 36 is coupled to the inverting input of amplifier 30. One terminal of capacitor 33 is coupled to node 36 and the other terminal is coupled to node 39.

One terminal of capacitor 32 is coupled to node 36 and the other terminal of capacitor 32 is coupled to node 38, the output of amplifier 30. The output of the circuit of the present invention Vout 29, is taken from node 38. Node 39 is coupled through switch B to node 34. Node 34 is coupled through switch A to node 36. Node 39 is also coupled through switch C to node 37. Node 37 is coupled to node 36 through switch D. Node 34 is also coupled to node 38 through switch 53 and node 37 is coupled to node 38 through switch 54.

Switches 51 and 53 are controlled by clock signal PH1 and are closed when PH1 is high. Switches 52 and 54 are controlled by clock signal PH2 and are closed when PH2 is high. As previously mentioned, PH1 and PH2 are non overlapping clock signals.

FIG. 4 illustrates that modulating signal FO 10 controls switches B and D while modulating signal $\overline{FO}$, provided by inverter 11, controls switches A and C. Switches B and D are controlled by modulating signal (FO) 10 and are closed when FO is high. Switches A and C are controlled by modulating signal $\overline{FO}$ and are closed when $\overline{FO}$ is high. Thus, switches A and C are open when switches B and D are closed and vice versa.

In the preferred embodiment of the present invention, Vin 13 is only available at phase 2 (PH2), the phase at which Vin is a valid signal and generates a valid output. During phase 1 (PH1) Vin 13 is not valid and input capacitor 31 is not coupled to Vin during phase 1. However, the configuration of the circuit of the present invention makes it possible for the input capacitor 31 to sample at only one phase (PH2). This is accomplished through proper switching of feedback capacitors 32 and 33.

The following table illustrates the four possible states of the circuit of FIG. 2.

| FO | $\overline{FO}$ | PH1 | PH2 | B, D | A, C | 51, 53 | 52, 54 | CAP31 |
|---|---|---|---|---|---|---|---|---|
| 1 | 0 | 1 | 0 | closed | open | closed | open | Ground |
| 1 | 0 | 0 | 1 | closed | open | open | closed | Vin |
| 0 | 1 | 1 | 0 | open | closed | closed | open | Ground |
| 0 | 1 | 0 | 1 | open | closed | open | closed | Vin |

There are four possible states of the prior art circuit illustrated in FIG. 1. These states are as follows:

| FO | $\overline{FO}$ | PH1 | PH2 | 22, 24 | 21, 23 | 17, 27 | 18, 28 | CAP31 |
|---|---|---|---|---|---|---|---|---|
| 1 | 0 | 1 | 0 | closed | open | closed | open | Vin |
| 1 | 0 | 0 | 1 | closed | open | open | closed | Ground |
| 0 | 1 | 1 | 0 | open | closed | closed | open | Ground |
| 0 | 1 | 0 | 1 | open | closed | open | closed | Vin |

Letting Vos equal the offset voltage of amplifier 30, the charge stored in capacitor C31 and the circuit configurations at each state for the prior art circuit of FIG. 1 are as follows:

| state | input capacitor | feedback loop | Node 36 |
|---|---|---|---|
| 1 (PH1) | Vin | short circuit | C31 (Vin-Vos) |
| 2 (PH2) | ground | through capacitors | C31 (Vos) |
| 3 (PH1) | ground | short circuit | C31 (Vos) |
| 4 (PH2) | Vin | through capacitors | C31 (Vin-Vos) |

The charge stored in capacitor C31 and the circuit configurations at each state for the present invention of FIG. 2 are as follows:

| state | input capacitor | feedback loop | Node 36 |
|---|---|---|---|
| 1 (PH1) | ground | through capacitors | C31 (Vos) |
| 2 (PH2) | Vin | short circuit | C31 (Vin-Vos) |
| 3 (PH1) | ground | short circuit | C31 (Vos) |
| 4 (PH2) | Vin | through capacitors | C31 (Vin-Vos) |

It can be seen that the input to the mixer is required to be valid at both phases for the prior art circuit of FIG. 1. However, the validity of the input of the present invention is not phase dependent and could be available at any phase. The output of the circuit of FIG. 2 is sampled on both phases PH1 and PH2 since the amplifier 30 is auto zeroed on either PH1 or PH2 as a function of FO. Thus, a valid output from amplifier 30 exists during phase 1 when FO is high and is also valid during phase 2 when FO is low. The switching scheme as illustrated in FIG. 2 is particularly useful for auto-zero circuits where the input signal is only available at one phase.

The operation of the present invention differs from the prior art circuit during states 1 and 2. Referring first to FIG. 1, we see that during state 1, the input capacitor C1 or 31 is coupled to Vin when FO is high and the feedback loop is short circuited. This occurs when PH1 is high (phase 1).

Referring now to FIG. 2, during state 1 the input capacitor 31 is grounded and the feedback loop is coupled to the inverting input of amplifier 30 through capacitors 32 and 33 in parallel when FO is high. This also occurs when PH1 is high (phase 1).

During state 2, the input capacitor of the prior art circuit is grounded when FO is high and the feedback loop is coupled through capacitors 32 and 33. In the present invention during state 2, the input capacitor is coupled to Vin and the feedback loop is short circuited, when FO is high.

Thus, a balanced modulator for use with auto-zero networks has been described, which requires an input that could be valid only at one phase.

I claim:

1. A circuit for modulating an input signal comprising:
    an operational amplifier having first and second inputs, said first input coupled to an input element, said second input coupled to a reference voltage;
    first and second switches coupled to said input element, said first switch coupled to said input signal, said second switch coupled to said reference voltage, said first and second switches controlled by first and second non-overlapping clock signals, respectively, such that said first switch is open when said second switch is closed;
    a feedback loop having at least one feedback element coupled to said operational amplifier, said feedback loop coupled to at least third and fourth switches controlled by said first and second non-overlapping clock signals respectively, and at least fifth, sixth, seventh and eighth switches controlled by third and fourth clock signals such that said fifth and said sixth switches are controlled by said third clock signal and said seventh and said eighth switches are controlled by said fourth clock signal, said third and fourth clock signals being non-overlapping clock signals and having a frequency lower than said first and second clock signals;
    said fifth, sixth, seventh and eighth switches such that, when said first and said third clock signals are high, said fifth and said sixth switches are closed and said seventh and said eighth switches are open so that said feedback loop is short-circuited, and when said first clock signal is high and said third clock signal is low, said fifth and said sixth switches are open and said seventh and said eighth switches are closed so that said feedback loop is coupled to said feedback element;
    said first and second non-overlapping clock signals and said third and fourth non-overlapping clock signals being controlled such that said amplifier is auto-zeroed.

2. The circuit of claim 1 wherein said input element comprises a first capacitor.

3. The circuit of claim 2 wherein said feedback element comprises a second capacitor.

4. The circuit of claim 3 wherein said reference voltage is ground.

5. A circuit for providing a balanced modulator coupled to a filter comprising:
    an operational amplifier having first and second inputs, said first input coupled to a first capacitor, said second input coupled to ground;
    first and second switches coupled to said first capacitor, said first switch coupled to an input signal, said second switch coupled to ground;
    third and fourth switches coupled to an output of said amplifier, said third switch coupled to fifth and seventh switches, said fourth switch coupled to sixth and eighth switches;
    said fifth and eighth switches coupled to said first input, said sixth and seventh switches coupled to a second capacitor, said second capacitor coupled to said first input;
    said second and third switches controlled by a first clock signal, said first and fourth switches controlled by a second clock signal, said first and second clock signal being non-overlapped such that when said first and fourth switches are open, said second and third switches are closed;
    said fifth and sixth switches controlled by a third clock signal, said seventh and eighth switches controlled by a complement of said third clock signal, a fourth clock signal, such that when said fifth and sixth switches are opened, said seventh and eighth switches are closed, said third and fourth clock signal having a lower frequency than said first and second clock signals.
    said first and second non-overlapping clock signals and said third and fourth non-overlapping clock signals being controlled such that said amplifier is auto-zeroed.

6. The circuit of claim 5 further including a third capacitor coupled to said output and to said first input.

7. The circuit of claim 5 wherein said third clock signal comprises a square wave.

* * * * *